United States Patent [19]

Yeh et al.

[11] Patent Number: 5,764,090
[45] Date of Patent: Jun. 9, 1998

[54] WRITE-CONTROL CIRCUIT FOR HIGH-SPEED STATIC RANDOM-ACCESS-MEMORY (SRAM) DEVICES

[75] Inventors: Wen-Chih Yeh, Hsinchu Hsien; Hsiao-Yueh Chang, Taipei, both of Taiwan

[73] Assignee: United Microelectronics Corporation, Taiwan

[21] Appl. No.: 702,955

[22] Filed: Aug. 26, 1996

[51] Int. Cl.[6] ............................................. H03K 5/04
[52] U.S. Cl. ........................ 327/174; 327/173; 327/176
[58] Field of Search ................................. 327/172–174, 327/176, 261, 263, 269–271, 276; 365/194

[56] References Cited

U.S. PATENT DOCUMENTS

| | | | |
|---|---|---|---|
| 5,055,706 | 10/1991 | Nakai et al. | 327/263 |
| 5,309,034 | 5/1994 | Ishibashi | 327/172 |
| 5,396,110 | 3/1995 | Houston | 327/172 |
| 5,546,034 | 8/1996 | Han | 327/174 |

FOREIGN PATENT DOCUMENTS

| | | | |
|---|---|---|---|
| 4-331506 | 11/1992 | Japan | 327/172 |

*Primary Examiner*—Timothy P. Callahan
*Assistant Examiner*—T. T. Lam
*Attorney, Agent, or Firm*—Rabin, Champagne & Lynt, P.C.

[57] ABSTRACT

A write-control circuit including a pulse processor and a waveform shifter is disclosed. The pulse processor is provided for processing a first waveform. When the first waveform has a bandwidth wider than a first delay, the waveform goes through the pulse processor without change. Otherwise, a second delay is added to trailing edge of the first waveform. The waveform shifter is provided for shifting the output waveform of the pulse processor as a second waveform. The pulse processor consists of a pulse generator, a trailing edge delay circuit, a NOR gate and an inverter. The pulse generator, which generates a finite-length pulse by the first waveform, includes a delay chain and a NAND gate. The delay chain may consist of an odd number of delay units. The trailing edge delay circuit includes an even number of delay units and a NAND gate for adding the second time delay to the trailing edge of the finite-length pulses. The output of the trailing edge delay circuit and the first waveform are both processed by the NOR gate, the inverter, and the waveform shifter to generate the second waveform.

9 Claims, 8 Drawing Sheets

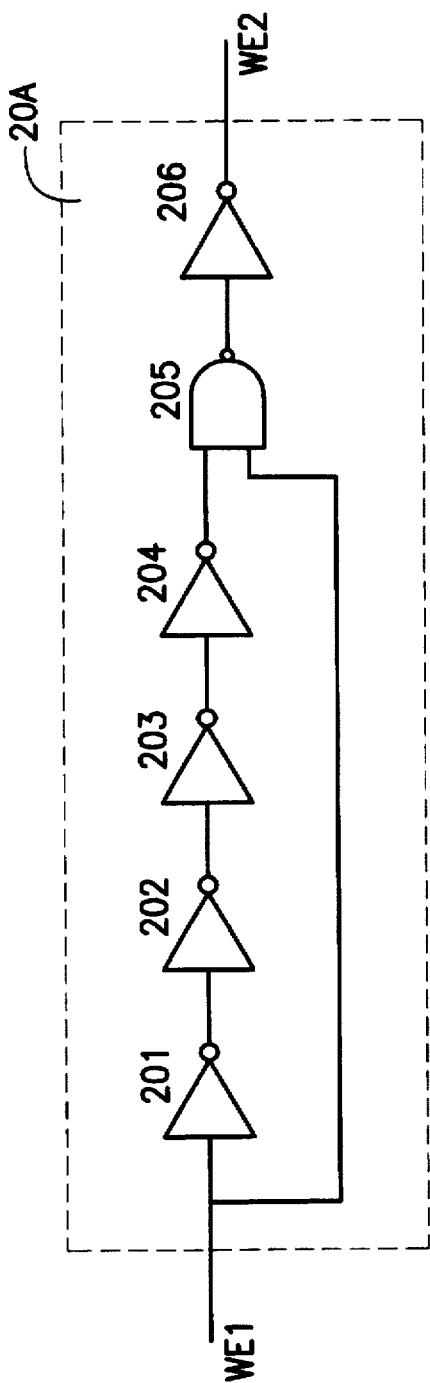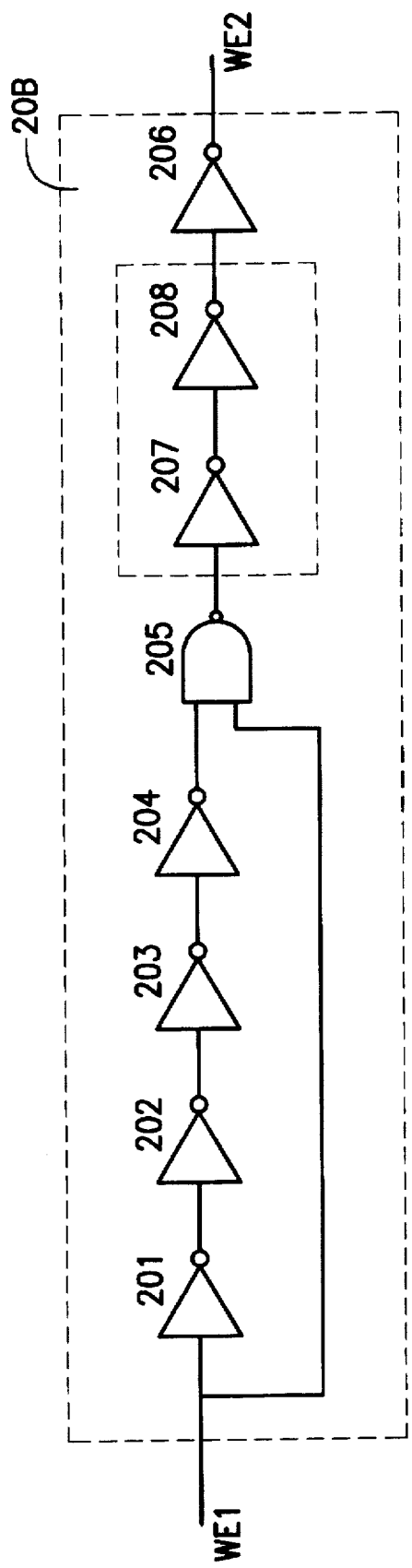
FIG. 5 (PRIOR ART)
FIG. 6 (PRIOR ART)

WRITE-CONTROL CIRCUIT FOR HIGH-SPEED STATIC RANDOM-ACCESS-MEMORY (SRAM) DEVICES

BACKGROUND OF THE INVENTION

1. Field of the Invention

The present invention relates to a static random-access-memory (SRAM) device, and more specifically, to a write-control circuit for SRAM devices.

2. Technical Background

When a static random-access-memory (SRAM) device performs a write operation, an address signal is required to choose a memory region for recording data. Moreover, there must be a write enable signal to start and terminate the write operation. The timing relationships of these control signals are depicted in FIG. 1. As shown in the figure, an inverse signal $\overline{WE}$ of the write enable signal WE has a low level interval completely corresponding to a fixed address signal. That is, during a write-enable period $t_{WP}$, the address signal does not change. Two time margins are also defined in the figure. A first time margin $t_{AS}$ is defined as the time interval between the changing point of the address signal and the falling edge of inverse write enable signal $\overline{WE}$. A second time margin $t_{WR}$ is defined as the time interval between the rising edge of inverse write enable signal $\overline{WE}$ and a next changing moment of the address signal. The two time margins are important for write control of the SRAM device. If the margins are not wide enough, erroneous writing may happen. Therefore, the values of time margins $t_{AS}$ and $t_{WR}$ are expected to be as large as possible to ensure a correct write operation.

For example, referring to the timing diagram of FIG. 2, a negative time margin $t_{AS}$ occurs as inverse write enable signal $\overline{WE}$ falls before the address signal changes. That is, the SRAM device starts the write operation before a new memory region is assigned for recording the data. The data may be written to an incorrect memory region or memory cell, and cannot be properly accessed anymore. Alternatively, referring to FIG. 3, when the next address signal comes before the write period is terminated, that is, when the address signal changes before inverse write enable signal $\overline{WE}$ rises, time margin $t_{WR}$ is negative, and the data will be written to an incorrect memory region or cell. Therefore, the address signal and inverse write enable signal $\overline{WE}$ have to be controlled correlatively to optimize the time margins.

A conventional SRAM control circuit is depicted in FIG. 4. Referring to the figure, the circuit includes an address buffer 10, a waveform shifter 20, a data buffer 30, a transmission gate 40 and memory cells 50. Inverse write enable signal $\overline{WE}$ is reversed by address buffer 10 to be signal WE1. Waveform shifter 20 modifies the waveform of signal WE1 according to the timing of the address signal, and then generates a proper write enable signal WE2. Data buffer 30 provides an I/O path for an external data which is about to be stored in the SRAM device. Therefore, the external data in data buffer 30 can be written in memory cells 50 when transmission gate 40 is turned on by signal WE2.

FIG. 5 depicts a conventional waveform shifter 20A for the SRAM device of FIG. 4. Waveform shifter 20A includes a number of inverters 201–204 which are connected in series as a delay chain, a NOR gate 205 and another inverter 206. NOR gate 205 has two input terminals: one receives the output end of inverter 204 and the other is connected to the input end of inverter 201. The output end of NOR gate 205 is connected to the input end of inverter 206. Signal WE1 enters the delay chain and is modified by the circuit to become signal WE2. Since the waveform of signal WE1 reaches NOR gate 205 through two paths of different delay time, the rising edges of the waveform of signal WE2 will be delayed, while the falling edges are not changed. Therefore, time margin $t_{AS}$ of the write enable signal can be extended without affecting time margin $t_{WR}$. However, as the tolerance of time margin $t_{AS}$ increases, the bandwidth of write enable signal, i.e., $t_{WP}$, is reduced. That is, the extension of the time margin may shorten the active write period, especially for a write enable signal whose waveform bandwidth has been minimized. Therefore, the effective write enable period will not be long enough for a complete data write operation in the memory device.

The circuit depicted in FIG. 6 is another conventional waveform shifter 20B. The circuit is almost the same as waveform sifter 20A of FIG. 5 except for an additional delay chain consisting of inverters 207 and 208 connected between NOR gate 205 and inverter 206. The delay chain is provided for further shifting and delaying the waveform of the write enable signal to increase time margin $t_{AS}$. Therefore, the aforementioned problem with improper active write interval also exists in waveform shifter 20B. Moreover, since the additional delay chain shifts the waveform, the non-ideal situation as shown in FIG. 3 may occur, thus increasing the probability of erroneous write operation.

SUMMARY OF THE INVENTION

Accordingly, the present invention provides a write-control circuit for SRAM devices to optimize the active write interval $t_{WP}$ while preventing insufficiency of time margin $t_{WR}$ when time margin $t_{AS}$ has been predetermined.

The write-control circuit of the present invention includes a pulse processor and a waveform shifter. The pulse processor is provided for processing a first waveform. When the first waveform has a bandwidth wider than a first delay, the waveform goes through the pulse processor without changing. Otherwise a second delay is added to the trailing edge of the first waveform. The waveform shifter is provided for shifting the output waveform of the pulse processor as a second waveform.

The pulse processor of the present invention consists of a pulse generator, a trailing edge delay circuit, a NOR gate and an inverter. The pulse generator, which generates a finite-length pulse by the first waveform, includes a delay chain and a NAND gate. The delay chain may consist of an odd number of delay units. The trailing edge delay circuit includes an even number of delay units and a NAND gate for adding the second time delay to the trailing edge of the finite-length pulse. The output of the trailing edge delay circuit and the first waveform are both processed by the NOR gate, the inverter, and the waveform shifter to generate the second waveform.

BRIEF DESCRIPTION OF THE DRAWINGS

Other objects, features, and advantages of the present invention will become apparent from the following detailed description of the preferred but non-limiting embodiment. The description is made with reference to the accompanying drawings in which:

FIG. 5 and FIG. 6 are circuit diagrams of the waveform shifter in FIG. 4;

DETAILED DESCRIPTION OF THE INVENTION

Figure 7:
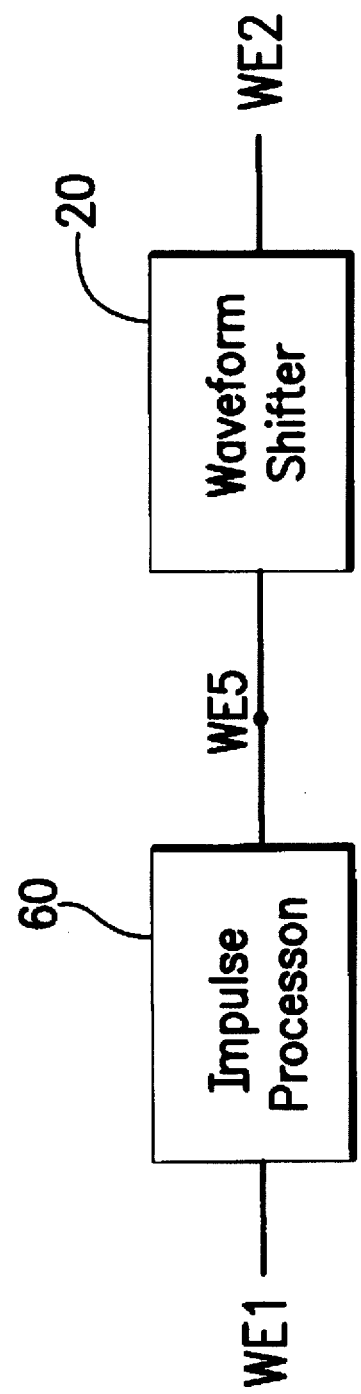
FIG. 7 is a block diagram illustrating the write-control circuit of the present invention.

Referring to FIG. 7, the SRAM write-control circuit according to the preferred embodiment of the present invention is illustrated. The circuit consists of an pulse processor 60 and a waveform shifter 20.

Figure 8:
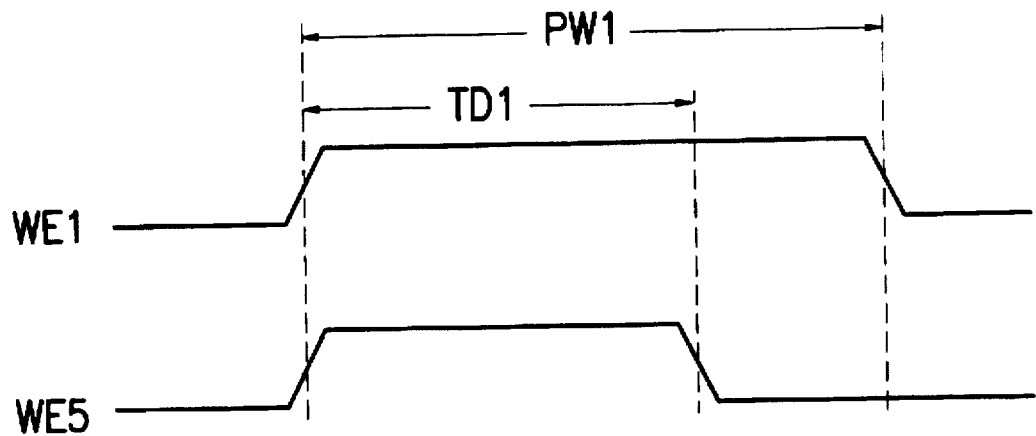
FIG. 8, FIG. 9A and FIG. 9B are timing diagrams of write enable signals in the write-control circuit of the present invention.
Figure 9A:
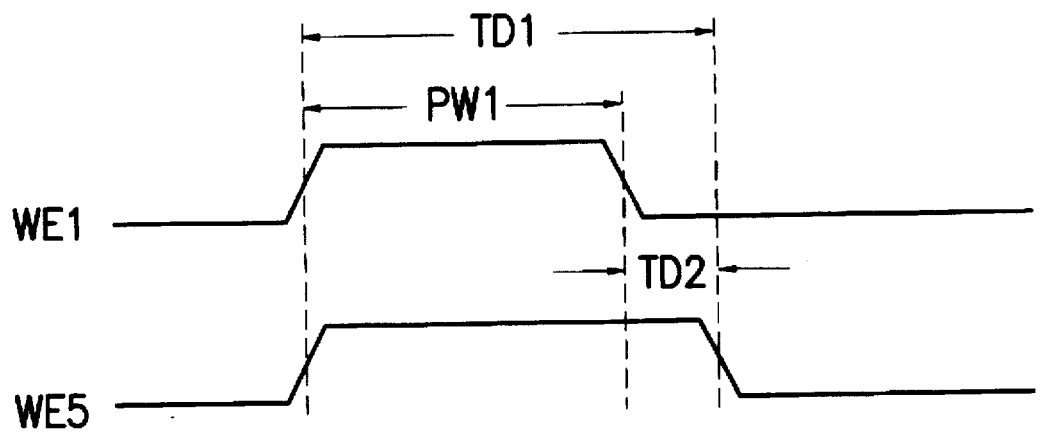
Figure 9B:
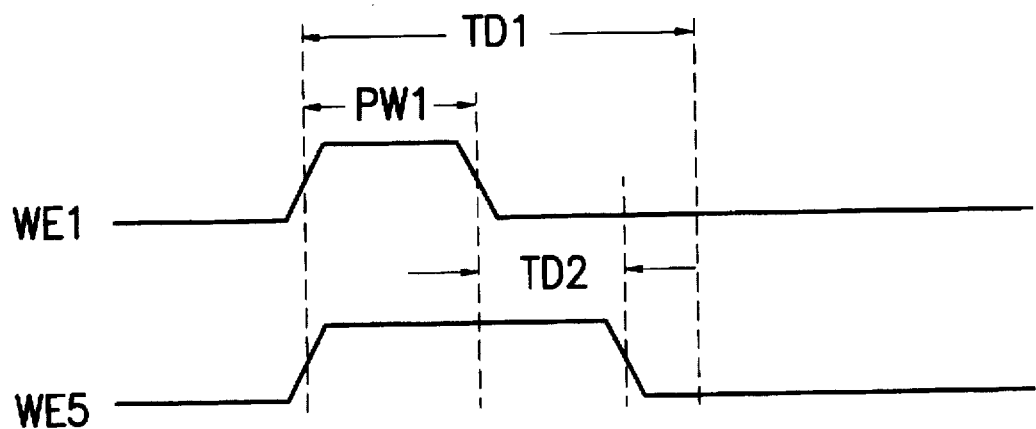

Pulse processor 60 processes a first waveform, i.e., waveform of signal WE1, to generate signal WE5. The bandwidth of the first waveform is defined as PW1. The first waveform and the waveform of signal WE5 are compared as illustrated in FIG. 8, FIG. 9A and FIG. 9B. The three figures represent three different situations according to the timing relations between signals WE1 and WE5.

Referring to FIG. 8, if the bandwidth of the first waveform, i.e., PW1, is wider than a first delay length TD1, the bandwidth of the waveform of signal WE5 is chosen to be TD1. Since first delay length TD1 guarantees the full time for a complete write operation, the minimal available write enable period for WE5 can be extracted from the too wide first waveform bandwidth PW1 by pulse processor 60.

Alternatively, when bandwidth PW1 is narrower than first delay length TD1, two situations are included, as shown in FIG. 9A and FIG. 9B. Referring to FIG. 9A, pulse processor 60 adds a second delay TD2 to signal WE1, thus generating signal WE5 with a bandwidth of first delay TD1. If bandwidth PW1 is even narrower, as shown in FIG. 9B, a constant second delay TD2 is added to signal WE1 even though the bandwidth of signal WE5 is still narrower than first delay TD1. The extra delay TD2 of signal WE5 can increase the effective interval of the write operation, thus preventing erroneous data from being written.

Figure 1:
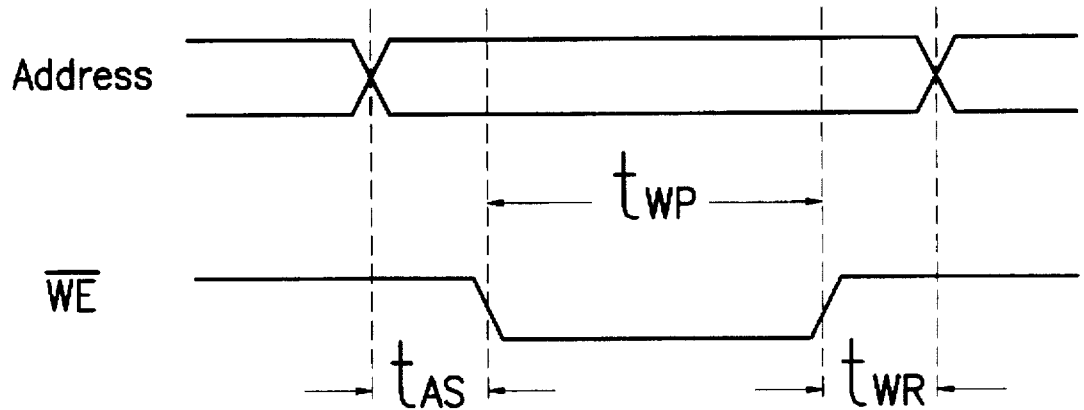
FIG. 1 through FIG. 3 are timing diagrams of the address signal and the inverse write enable signal.
Figure 2:
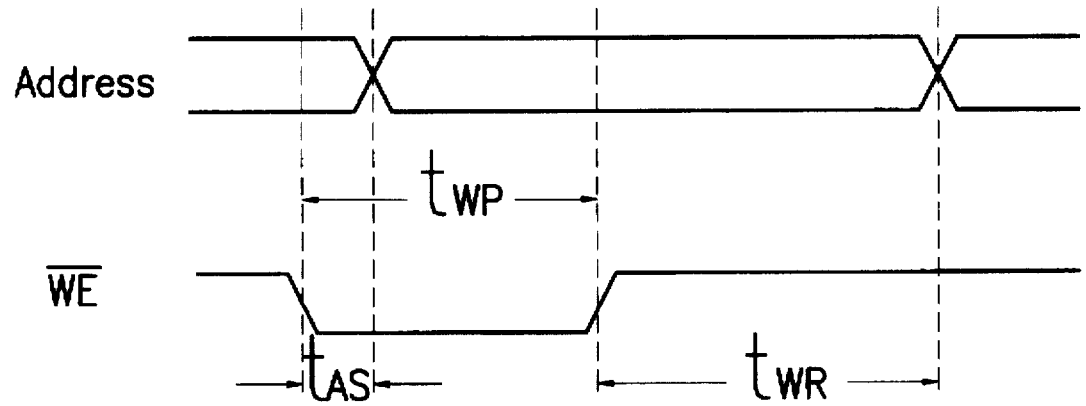
Figure 3:
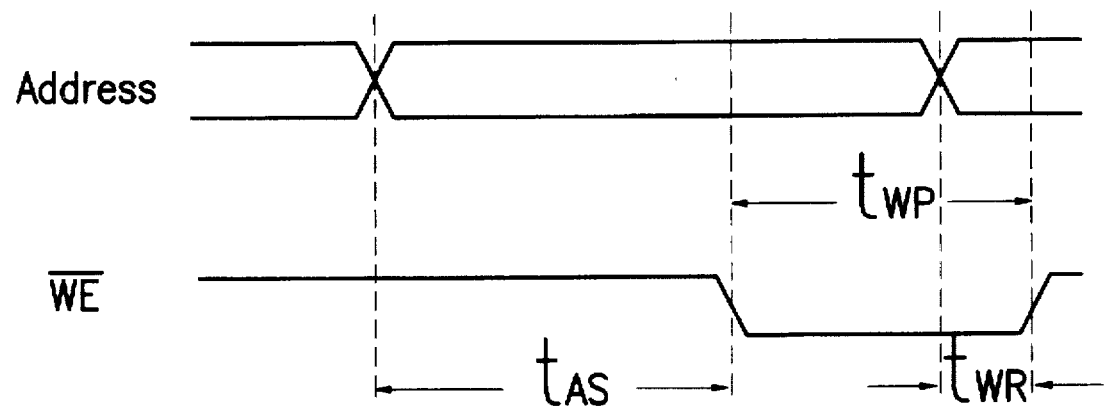
Figure 4:
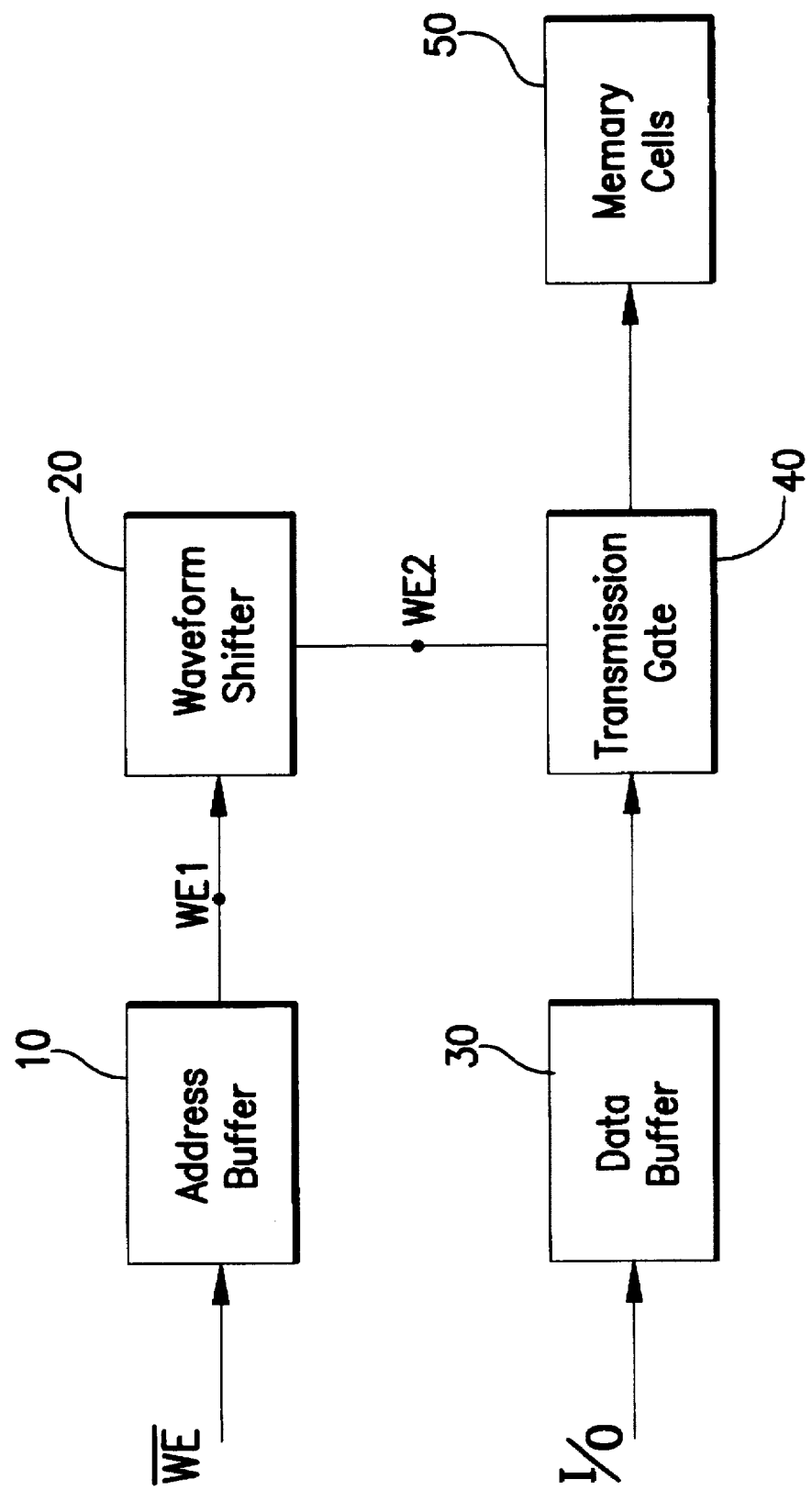
FIG. 4 is a schematic diagram illustrating a conventional SRAM circuit.

Similar to the conventional waveform shifter shown in FIG. 4, waveform shifter 20 of the present invention modifies the waveform of signal WE5. That is, waveform shifter 20 extends time margin $t_{AS}$ of the write enable signal without affecting time margin $t_{WR}$. Therefore, the circuit structure of waveform shifter 20 can be the same as those illustrated in FIG. 5 and FIG. 6.

Figure 10:
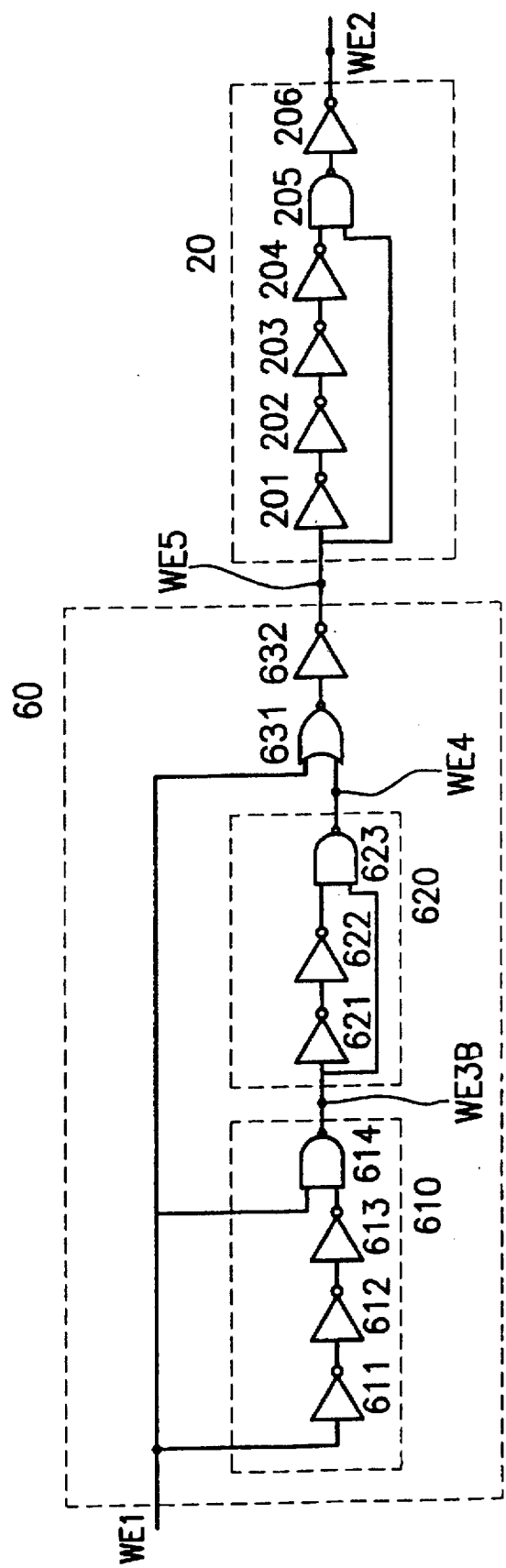
FIG. 10 is a preferred circuit diagram of the write-control circuit shown in FIG. 7.

The preferred circuit structure of pulse processor 60 according to the present invention is illustrated in FIG. 10. Referring to the figure, pulse processor 60 consists of a pulse generator 610, a trailing edge delay circuit 620 and logic gates 631 and 632. Pulse generator 610 generates a finite width pulse WE3B based on the first waveform, i.e., the waveform of signal WE1. Trailing edge delay circuit 620 delays the trailing edge of pulse WE3B by the second delay, thus generating a signal WE4. Therefore, signal WE5 will be obtained when signals WE1 and WE4 are both processed by logic gate 631 and then through inverter 632.

Pulse generator 610 includes a delay chain, which may consist of an odd number of delay units, and a logic gate. For example, as shown in FIG. 10, pulse generator 610 of the present invention includes inverters 611, 612 and 613 and a NAND gate 614. Inverters 611–613 are delay units and are connected in series as the delay chain. NAND gate 614 has two input ends which are connected to the input end and output end of the delay chain, respectively. Thus, one input end receives directly signal WE1, and the other receives delayed signal WE1 through the delay chain. Therefore, the waveform width of output signal WE3B of NAND gate 614 can be fixed by the delay length of the delay chain. That is, finite length pulse WE3B can be generated by pulse generator 610.

Trailing edge delay circuit 620 includes an even number of delay units and a logic gate. The circuit structure of trailing edge delay circuit 62 as illustrated in FIG. 10 consists of two inverters 621 and 622 and a NAND gate 623. The two inverters are connected in series as a delay chain. NAND gate 623 has two input ends which are connected to the input end and output end of the delay chain, respectively. Trailing edge delay circuit 620 receives signal WE3B for generating another signal WE4.

NOR gate 631 processes the first waveform of signal WE1 and the output waveform from trailing edge delay circuit 620, i.e., WE4. Inverter 632 inverts the result from NOR gate 631 and sends the inverted result to waveform shifter 20 for generating the second waveform of signal WE2.

Figure 11:
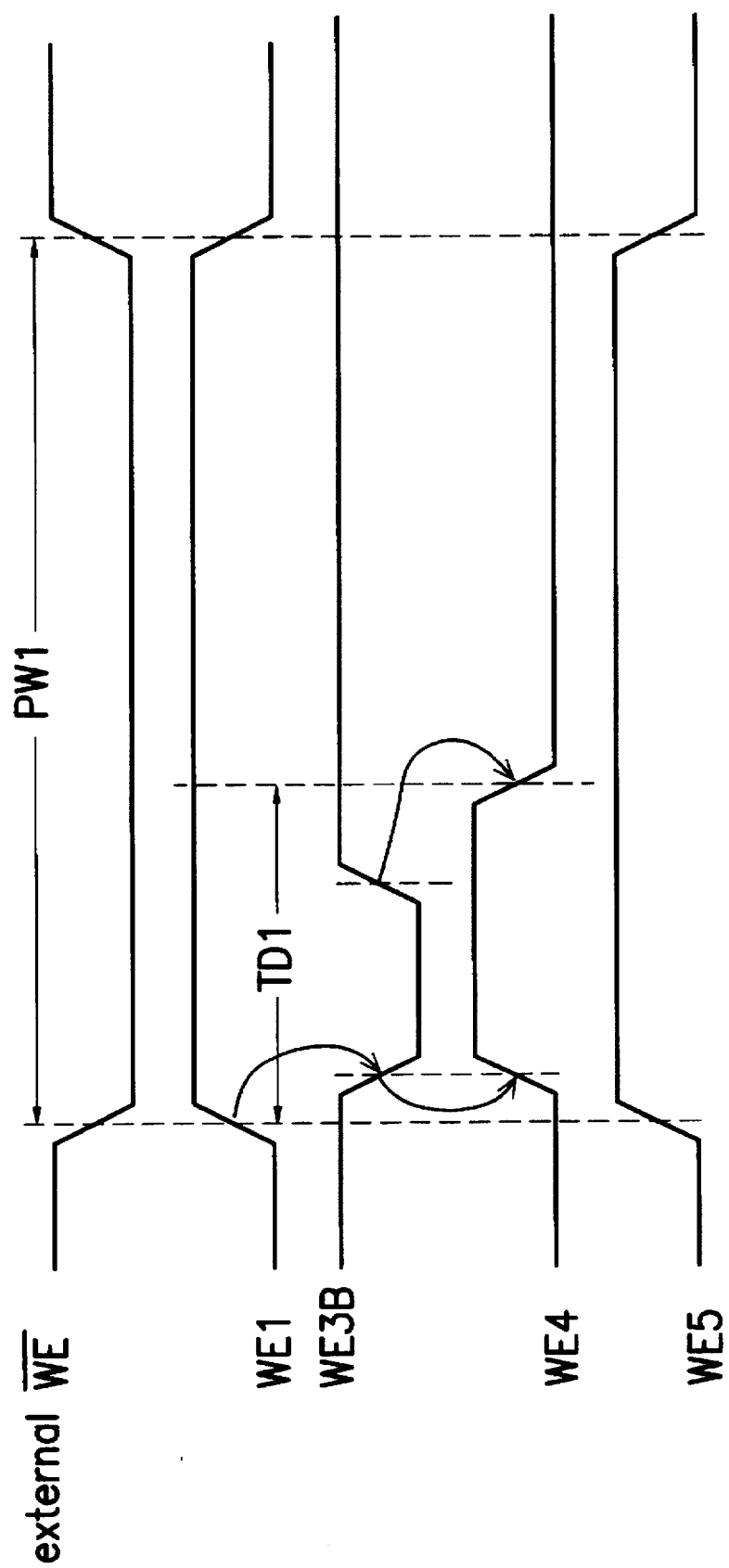
FIG. 11 and FIG. 12 are timing diagrams of the write enable signals in the write-control circuit of FIG. 10.
Figure 12:
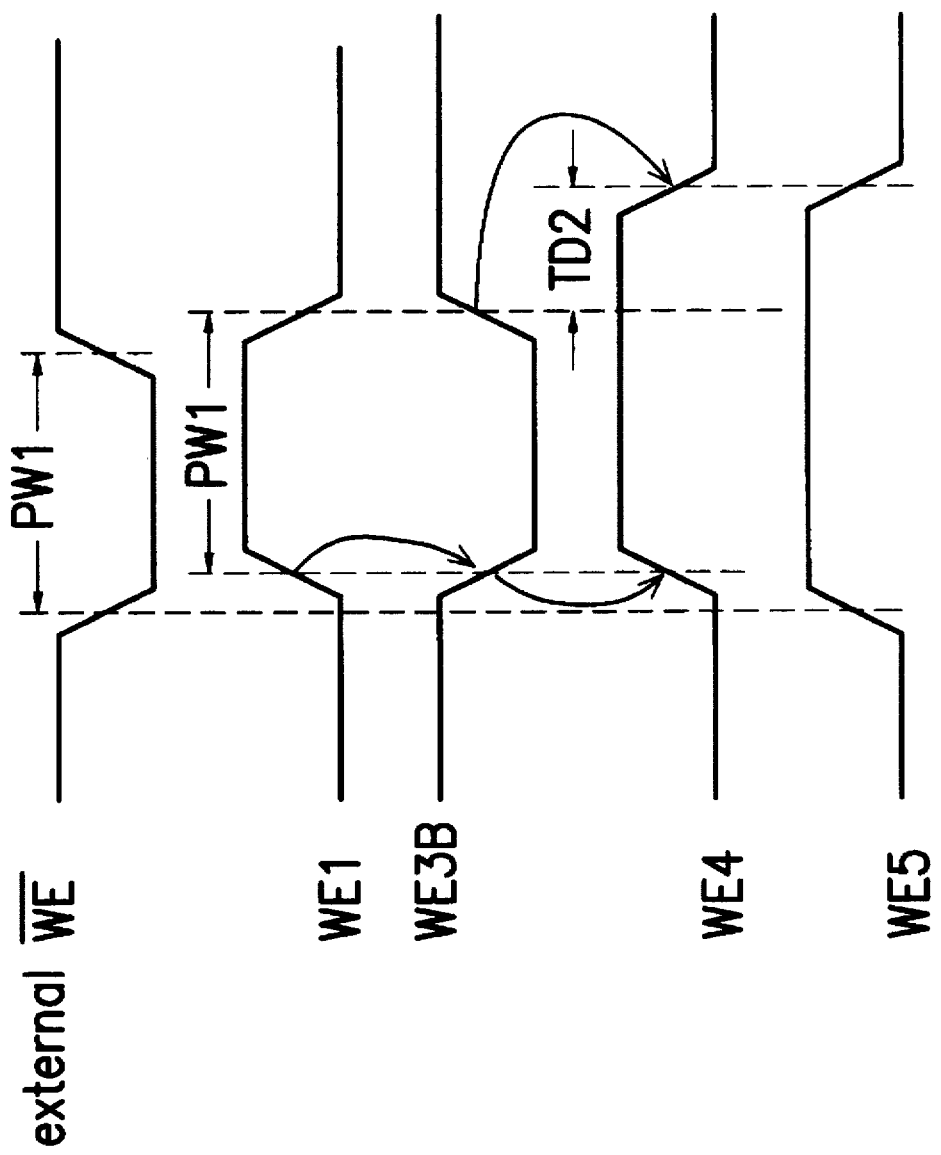

The waveforms of the aforementioned signals are illustrated in FIG. 11 and FIG. 12. Referring to FIG. 11, the waveform bandwidth of first signal WE1, i.e., interval PW1, is longer than first delay length TD1. Therefore, the intermediate signals WE3B and WE4 do not affect the waveform of signal WE5. That is, signal WE5 is completely determined by signal WE1 if interval PW1 is longer than first delay length TD1. Alternatively, referring to FIG. 12, when the waveform of signal WE1 is shorter than first delay length TD1, the waveform length of signal WE5 will be determined by signal WE4 whose waveform bandwidth is longer. Since second delay length TD2 is added to the trailing edge of signal WE4 by trailing edge delay circuit 62, the waveform lengths of signal WE4 and that of WE5 are extended by a constant.

In the present invention, since the modification of the waveform is by way of finite-width pulse WE3B instead of directly changing original signal WE1, the merits of the original write enable signal WE1 can be retained. Therefore, the extended signal WE5 can provide an optimal time interval $t_{WP}$ and can prevent the insufficiency of time margin $t_{WR}$ when $t_{AS}$ is improved by waveform shifter 20. Thus, through waveform shifter 20, a second waveform of write enable signal WE2 can be obtained.

What is claimed is:

1. A write-control circuit for transforming a first waveform of a write enable signal into a second waveform, comprising:

a pulse processor for processing said first waveform of said write enable signal; said pulse processor bypassing said first waveform when said first waveform has a bandwidth wider than a first delay, and otherwise adding a second delay to a trailing edge of said first waveform, and a waveform shifter for shifting an output waveform of said pulse processor as said second waveform;

wherein said pulse processor further comprises:

a pulse generator for generating a finite-width pulse according to said first waveform;

a trailing edge delay circuit for shifting the trailing edge of said finite-width pulse; and a number of logic gates for processing said first waveform and an output waveform from said trailing edge delay circuit.

2. The write-control circuit as claimed in claim 1, wherein said waveform shifter delays only a leading edge of said output waveform from said pulse processor.

3. The write-control circuit as claimed in claim 1, wherein said pulse generator consists of a logic gate and an odd number of delay units which are connected in series as a delay chain.

4. The write-control circuit as claimed in claim 3, wherein said delay units are inverters.

5. The write-control circuit as claimed in claim 3, wherein said logic gate is a NAND gate whose two input ends are connected to the input end and output end of the delay chain, respectively.

6. The write-control circuit as claimed in claim 1, wherein said trailing edge delay circuit consists of a logic gate and an even number of delay units which are connected in series as a delay chain.

7. The write-control circuit as claimed in claim 6, wherein said delay units are inverters.

8. The write-control circuit as claimed in claim 6, wherein said logic gate is a NAND gate whose two input ends are connected to the input end and output end of the delay chain, respectively.

9. The write-control circuit as claimed in claim 1, wherein said logic gates include:

a NOR gate for processing said first waveform and an output waveform from said trailing edge delay circuit; and an inverter for inverting the result from said NOR gate and connecting to said waveform shifter.

* * * * *